United States Patent [19]
Motoshima et al.

[11] Patent Number: 5,847,994
[45] Date of Patent: Dec. 8, 1998

[54] NON-VOLATILE SEMICONDUCTOR MEMORY DEVICE HAVING A BACK GROUND OPERATION MODE

[75] Inventors: Akiko Motoshima; Tomoshi Futatsuya; Akira Okugaki, all of Hyogo, Japan

[73] Assignee: Mitsubishi Denki Kabushiki Kaisha, Tokyo, Japan

[21] Appl. No.: 46,672

[22] Filed: Mar. 24, 1998

[30] Foreign Application Priority Data

Sep. 8, 1997 [JP] Japan .................................. 9-242643

[51] Int. Cl.⁶ .......................... G11C 16/04; G11C 16/06; G11C 7/00
[52] U.S. Cl. ................ 365/185.11; 365/185.22; 365/185.29; 365/185.33; 365/218
[58] Field of Search ........................ 365/185.11, 185.22, 365/185.27, 185.29, 185.33, 218, 230.03, 185.03

[56] References Cited

U.S. PATENT DOCUMENTS

| | | | |
|---|---|---|---|
| 5,523,980 | 6/1996 | Sakui et al. | 365/230.03 |
| 5,535,158 | 7/1996 | Yamagat | 365/185.29 |
| 5,671,388 | 9/1997 | Hasbun | 365/185.03 |

FOREIGN PATENT DOCUMENTS

| | | |
|---|---|---|
| 60-125994 | 7/1985 | Japan . |
| 8-18018 | 1/1996 | Japan . |

Primary Examiner—David Nelms
Assistant Examiner—Trong Phan
Attorney, Agent, or Firm—McDermott, Will & Emery

[57] ABSTRACT

In a flash memory, a reading bit line and a writing bit line are provided corresponding to a respective column of memory cells. A well voltage and a voltage on a source line can be controlled for each sub-block. Accordingly, data can be read at a sub-block while data can be written/erased at another sub-block, and therefore, the capacity ratio of a back ground operation region to the main memory region can be changed as desired.

5 Claims, 11 Drawing Sheets

WRITING

ERASING

NON-VOLATILE SEMICONDUCTOR MEMORY DEVICE HAVING A BACK GROUND OPERATION MODE

BACKGROUND OF THE INVENTION

1. Field of the Invention

The present invention relates to non-volatile semiconductor memory devices, and particularly to a non-volatile semiconductor memory device having a back ground operation mode for performing data reading and data writing/erasing in parallel.

2. Description of the Background Art

Recently, as a memory device for use in a portable personal computer or a communication apparatus, a flash memory having a Back Ground Operation (BGO) mode has been developed. This BGO mode enables reading operation to be effected in a main memory block at the same time as writing/erasing operation is performed in a BGO block.

FIG. 9 is a partially omitted, block diagram illustrating the configuration of a conventional flash memory having such a BGO mode. Referring to FIG. 9, the flash memory includes an address buffer 30, a BGO block 31, a main memory block 41, X decoders 32, 42, Y decoders 33, 43, SG·SL decoders 34, 44, write/read circuits 35, 45, an input buffer 50, an output buffer 51 and a controller 52.

BGO block 31 includes a plurality of sub-blocks BLK0–BLKn (n is a natural number) formed on the surface of a well W31 of a semiconductor substrate. Each of sub-blocks BLK0–BLKn includes, as shown in FIG. 10: a plurality of memory cells MC arranged in rows and columns; a plurality of word lines WL0–WLm (m is a natural number) provided for respective rows of the memory cells; a source line (or voltage control line) SL provided for each two adjacent rows; a plurality of sub-bit lines SBL0, SBL1, provided for respective columns (only two columns are shown in FIG. 10 for the sake of simplicity); and a select gate SG (an N channel MOS transistor) provided for a respective column. A plurality of main bit lines MBL0, MBL1 are commonly provided for sub-blocks BLK0–BLKn, and each sub-bit line SBL is connected to a main bit line MBL via select gate SG.

As illustrated in FIGS. 11A and 22B, each memory cell MC has a floating gate 62 formed on the surface of well W31 with an insulating layer interposed therebetween, a control gate 63 formed on floating gate 62 with another insulating layer interposed, and a source (or first conduction node) 61s and a drain (or second conduction node) 61d formed on the surface of well W31 at the opposite sides of gates 62 and 63. Control gate 63, drain 61d and source 61s are connected to corresponding word line WL, sub-bit line SBL and source line SL, respectively.

In the writing operation, as shown in the first row of Table 1 below, drain 61d and control gate 63 of memory cell MC receive voltages of +6 V and -8 V, respectively, source 61s is set to an open (floating) state, and well W31 is grounded. Accordingly, as shown in FIG. 11A, electrons are extracted from floating gate 62 to drain 61d because of tunnel effect, and thus, as shown in FIG. 12, the threshold voltage Vth of memory cell MC is lowered to approximately 2V, i.e., data "0" is written.

TABLE 1

|       | drain  | gate   | source | well |
|-------|--------|--------|--------|------|
| write | +6 V   | -8 V   | opened | 0 V  |
| erase | opened | +10 V  | -8 V   | -8 V |
| read  | 1 V    | +3.3 V | 0 V    | 0 V  |

In the erasing operation, as shown in the second row of Table 1, a voltage of +10 V is applied to control gate 63 of memory cell MC, a voltage of -8 V is applied to both source 61s and well W31, and drain 61d is opened. As a result, as shown in FIG. 11B, electrons are injected from source 61s and well W31 into floating gate 63 owing to tunnel effect, and accordingly, as shown in FIG. 12, threshold voltage Vth of memory cell MC is raised to about 6 V, and data "1" is written.

In the reading operation, as shown in the bottom row of Table 1, a voltage of 1 V is applied to drain 61d of memory cell MC, +3.3 V to control gate 63, and 0 V to source 61s and well W31. In this condition, as shown in FIG. 12, whether threshold current Ith (normally in the order of several tens μA) flows between drain 61d and source 61s is detected. Current Ith flows when data "0" is written in memory cell MC; otherwise, the current Ith will not flow.

In the write verifying operation, a voltage of 1 V is applied to drain 61d of memory cell MC, a voltage slightly greater than an intended threshold voltage Vth (e.g., 2.5 V) to control gate 63, and 0V to source 61s and well W31, and whether a predetermined amount of current Ic flows between drain 61d and source 61s is detected. It should be noted that data writing is divided over several times to prevent threshold voltage Vth of memory cell MC from varying, and is stopped once current Ic is detected.

In the erase verifying operation, a voltage of 1 V is applied to drain 61d of memory cell MC, a voltage slightly lower than an intended threshold voltage Vth (5.5 V, for example) to control gate 63, 0 V to source 61s and well W31, to detect whether or not current Ic flows between drain 61d and source 61s. Erasing of data is effected until threshold voltage Vth of memory cell MC attains to about 6 V, and brought to stop when the current Ic is no longer detected.

Referring back to FIG. 9, address buffer 30 selectively provides externally applied address signals A0–Aj (j is a natural number) to each of decoders 32–34, 42–44.

X decoder 32 selects any of the plurality of word lines WL according to an address signal, and applies to the selected word line WL a voltage of -8 V, +10 V, +3.3 V, +2.5 V or +5.5 V, depending on the operating mode.

Y decoder 33 outputs any of a plurality of column select signals φ0, φ1 according to an address signal, and selects any of the plurality of main bit lines MBL.

SG·SL decoder 34 selects any sub-block (BLKn, for example) from the plurality of sub-blocks BLK0–BLKn according to an address signal, renders select gates SGn of the selected sub-block BLKn conducting, and couples sub-bit lines SBL0, SBL1 of the selected sub-block BLKn to main bit lines MBL0, MBL1, respectively. SG·SL decoder 34 also sets a well voltage VW to 0 V or -8 V and source line SL to an open state, 0 V or -8 V, depending on the operating mode.

Write/read circuit 35 includes, as illustrated in FIG. 10, a plurality of data buffers DB0, DB1, provided for each respective column, a plurality of Y gates (N channel MOS transistors) YG0, YG1, provided for each respective column, a data read line RL, a sense amplifier 53, and write control circuit 54.

Data buffers DB0 and DB1 are connected to main bit lines MBL0 and MBL1, respectively, and provide the lines with a writing voltage (+6 V) in a pulse manner in response to write signals RS0 and RS1 applied from write control circuit 54.

Y gates YG0 and YG1 are connected between main bit lines MBL0, MBL1 and data read line RL, respectively, and receive at their respective gates column select signals φ0, φ1 output from Y decoder 33, respectively. When column select signal φ0 is brought to a selected, high level, for example, Y gate YG0 is rendered conductive, and main bit line MBL0 is coupled to data read line RL.

In the reading operation, sense amplifier 53 applies a voltage of 1 V to drain 61d of a selected memory cell MC, via data read line RL, Y gate YG, main bit line MBL, select gate SG and sub-bit line SBL, to detect whether or not current flows thereinto, and outputs the data corresponding to the result of the detection via output buffer 51 to the outside. In the write verifying operation, sense amplifier 53 applies a voltage of 1 V to the drain of a selected memory cell MC to detect whether or not current Ic flows thereinto, and, in response to the current Ic flowing in, provides a write stop signal STP to write control circuit 54. In the erase verifying operation, sense amplifier 53 applies a voltage of 1 V to the drain of a selected memory cell MC to detect whether or not current Ic flows thereinto, and provides X decoder 32 with an erase stop signal (not shown) to stop the erasing operation when current Ic stops flowing in.

Write control circuit 54 supplies write signal RS to data buffer DB according to data Din externally applied through input buffer 50 and writes data into a selected memory cell MC. This writing operation is brought to stop in response to signal STP output from sense amplifier 53.

Main memory block 41, X decoder 42, Y decoder 43, SG-SL decoder 44 and write/read circuit 45 have configurations fundamentally similar to those of BGO block 31, X decoder 32, Y decoder 33, SG·SL decoder 34 and write/read circuit 35, except that the former has more columns than the latter.

Controller 52 selects a predetermined operating mode according to externally applied control signals /CE, /OE, and /WE, and command signal CMD also externally applied through input buffer 50, and controls the entire flash memory.

Now, the operation of the flash memory will be described in brief.

Firstly, an operating mode is set by controller 52 provided with control signals /CE, /OE, /WE and command signal CMD.

In the writing operation, a voltage of −8 V is applied to the word line WL corresponding to a memory cell MC designated by address signals A0–Aj, the memory cell MC is connected to main bit line MBL via select gate SG, source line SL is opened, and well voltage VW is set to 0 V. In this state, write control circuit 54 and data buffer DB apply a voltage of +6 V to main bit line MBL in a pulse manner so as to write data "0" into the selected memory cell MC in several steps. Sense amplifier 53 verifies whether writing of data "0" has been completed, or in other words, whether threshold voltage Vth of memory cell MC has attained to 2 V.

In the erasing operation, source line SL and well voltage VW are set to −8 V. In this state, a voltage of +10 V is applied in a pulse manner to a word line WL designated by address signals A0–Aj and the data in memory cell MC connected to the word line WL is thus erased over several steps. Again, sense amplifier 53 verifies if the data has been completely erased, or whether threshold voltage Vth of memory cell MC has reached to 6 V.

In the reading operation, memory cell MC designated by address signals A0–Aj is connected to sense amplifier 53 via sub-bit line SBL, select gate SG, main bit line MBL, Y gate YG and data read line RL, and a voltage of +3.3 V is applied to the word line WL for that memory cell MC. The data in memory cell MC is read out by sense amplifier 53, and output via output buffer 51 to the outside.

When the BGO is performed, data reading at main memory block 41 and data writing/erasing at BGO block 31 are effected simultaneously.

However, a conventional flash memory has regions for BGO block 31 and main memory block 41 both fixed, and thus it was impossible to alter the capacity ratio between blocks 31 and 41 depending on applications.

SUMMARY OF THE INVENTION

Accordingly, it is a main object of the present invention to provide a non-volatile semiconductor memory device capable of setting a BGO region and a main memory region arbitrarily and changing the capacity ratio therebetween as desired.

Describing a first exemplary non-volatile semiconductor memory device according to the present invention in brief, each row of memory cells is formed in a specific well and is provided with a corresponding voltage control line, and each column is provided with a corresponding reading bit line and a corresponding writing bit line. Consequently, data reading can be performed at a memory cell in a row while data writing/erasing is performed at a memory cell of another row. That is, the back ground operation mode can be effected in one memory cell array, and the capacity ratio between the BGO region and the main memory region can thus be changed for each row as required.

Preferably, mode execution circuitry includes: read circuitry for reading data from a memory cell via a reading bit line; write circuitry for writing data into a memory cell via a writing bit line; and erase circuitry for erasing data from a memory cell. Accordingly, the mode execution circuitry can readily be configured.

The mode execution circuitry, preferably, further includes: first verifying circuitry for detecting via a writing bit line a threshold voltage of a selected memory cell after each data writing operation, and, in response to the detected value reaching a first predetermined value, stopping the subsequent data writing operation; and second verifying circuitry for detecting via a writing bit line a threshold voltage of a selected memory cell after each data erasing operation, and, in response to the detected value reaching a second predetermined value, stopping the subsequent data erasing operation. By this configuration, the threshold voltage of a memory cell can be prevented from varying.

Preferably, the mode execution circuitry still further includes: first verifying circuitry for charging the writing bit line corresponding to a selected memory cell after each data writing operation, then setting the selected memory cell to a read enabled state, and, when the thus charged writing bit line is discharged, stopping the subsequent data writing operation; and second verifying circuitry for charging the writing bit line corresponding to a selected memory cell after each data erasing operation, then setting the selected memory cell to a read enabled state, and, when the thus charged writing bit line is not discharged, stopping the subsequent data erasing operation. This simple arrangement can suppress variation in the threshold voltage of a memory cell.

Describing in brief a second exemplary non-volatile semiconductor memory device according to the present invention, each memory cell array is formed in a specific well, and is provided with a voltage control line corresponding to a respective row. A reading bit line and a writing bit line are provided corresponding to a respective column commonly over a plurality of memory cell arrays. Consequently, data reading can be performed at a memory cell in a memory cell array while data writing/erasing is performed at a memory cell in another memory cell array. Therefore, the capacity ratio between the BGO region and the main memory region can be altered arbitrarily for each memory cell array.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
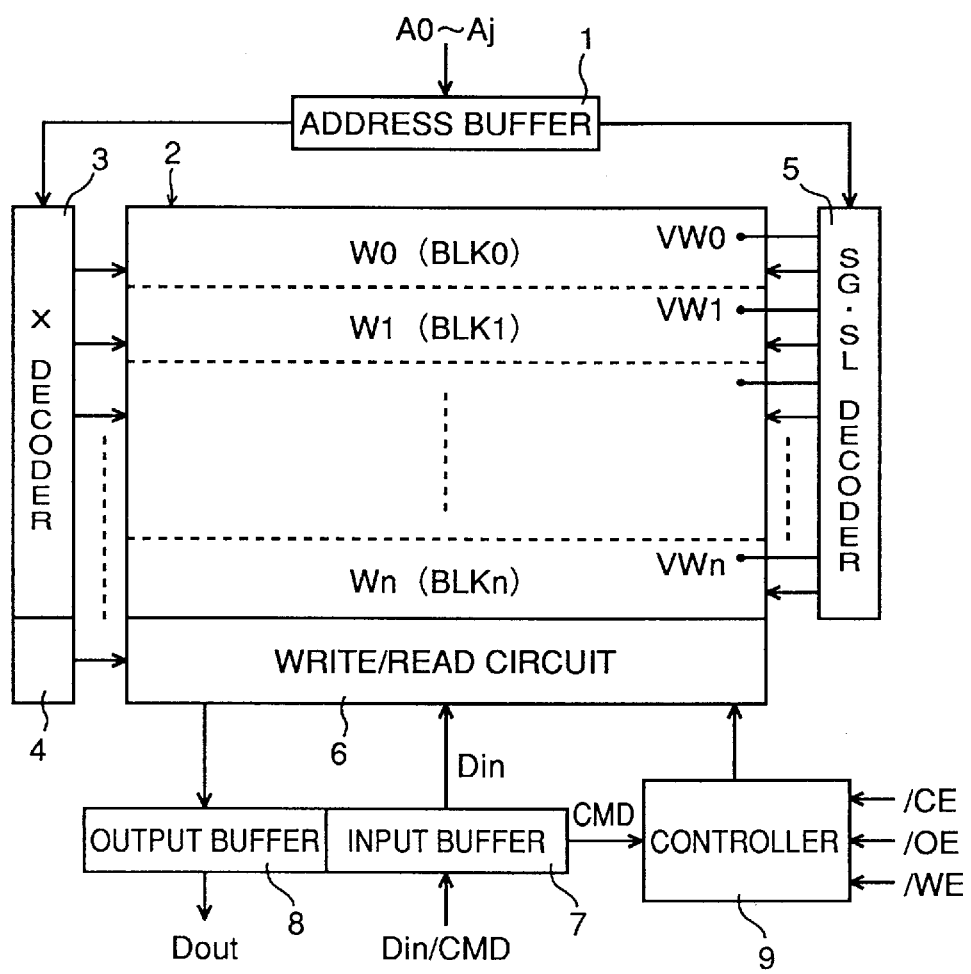
FIG. 1 is a partially omitted, block diagram showing the configuration of a flash memory according to a first embodiment of the present invention.

FIG. 1 is a partially omitted, block diagram showing the configuration of a flash memory having a BGO mode according to the first embodiment of the present invention. Referring to FIG. 1, the flash memory includes an address buffer 1, a memory cell array 2, an X decoder 3, a Y decoder 4, an SG·SL decoder 5, a write/read circuit 6, an input buffer 7, an output buffer 8 and a controller 9. Memory cell array 2 serves as both BGO block 31 and main memory block 41 shown in FIG. 5.

Figure 2:
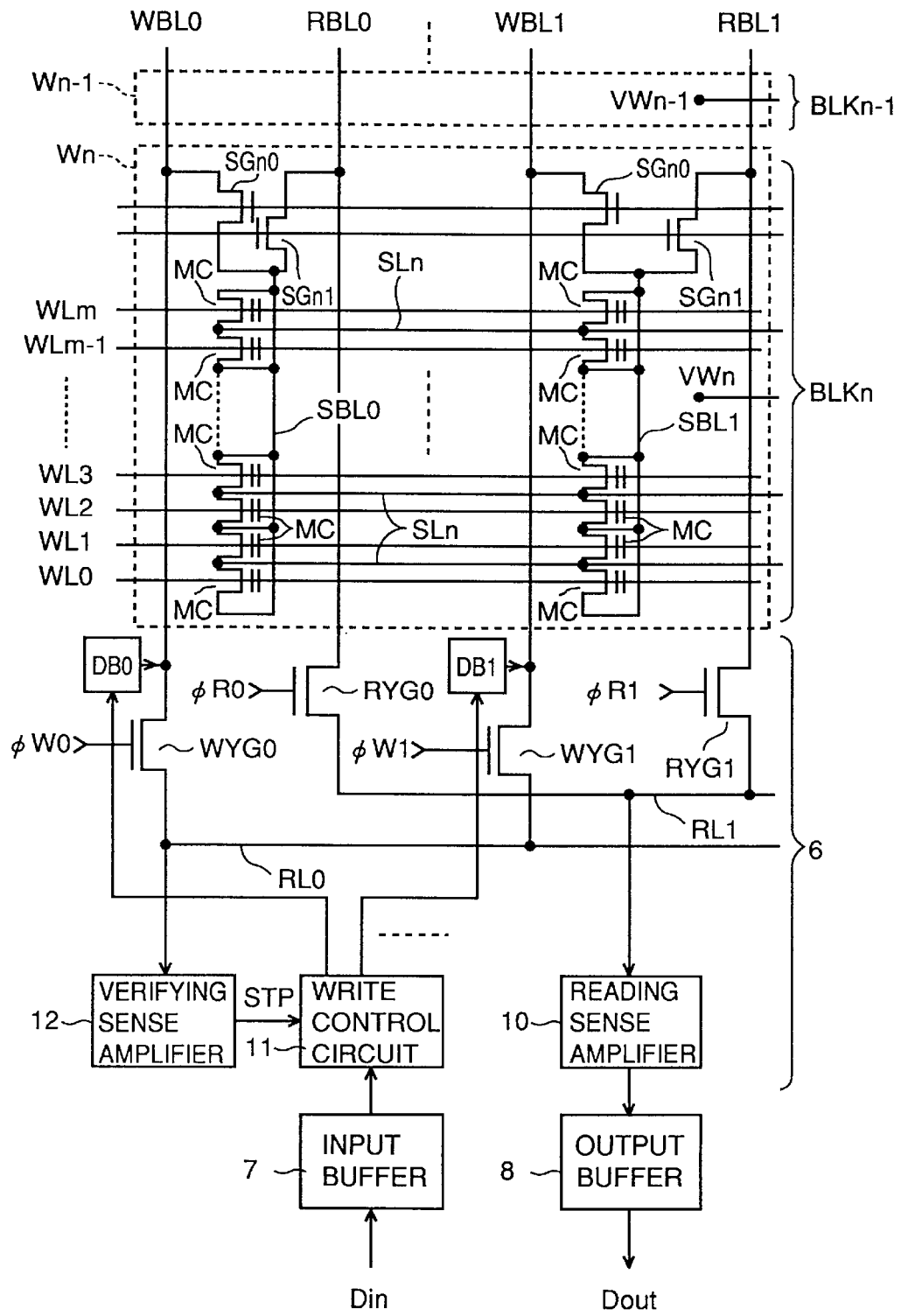
FIG. 2 is a block circuit diagram showing the configuration of a main portion of the flash memory shown in FIG. 1.

Memory cell array 2 includes a plurality of sub-blocks BLK0–BLKn formed on the surface of a plurality of wells W0–Wn of a semiconductor substrate. As shown in FIG. 2, sub-block BLKn includes: a plurality of memory cells MC arranged in rows and columns; a plurality of word lines WL0–WLm corresponding to respective rows; a source line SLn provided for each two adjacent rows; a plurality of sub-bit lines SBL0, SBL1, each corresponding to a respective column (only two columns are shown in FIG. 2 for simplicity); and select gates SGn0, SGn1 (N channel MOS transistors) each provided for a respective column. Further, a plurality of sets of reading main bit lines and writing main bit lines WBL0, RBL0; WBL1, RBL1, are provided commonly to sub-blocks BLK0–BLKn. Each sub-bit line SBL is connected to writing main bit line WBL via select gate SGn0 as well as to reading main bit line RBL via select gate SGn1. This arrangement applies to the other sub-blocks BLK0 through BLKn–1.

Referring back to FIG. 1, address buffer 1 selectively provides each of decoders 3–5 with externally applied address signals A0–Aj.

X decoder 3 selects any of the plurality of word lines WL according to an address signal, and applies to the selected word line WL a voltage of –8 V, +10 V, +3.3 V, +2.5 V or +5.5 V depending on the operating mode.

In the writing operation, Y decoder 4 outputs any of a plurality of column select signals φW0, φW1, according to an address signal, and selects any of the plurality of writing main bit lines WBL0, WBL1. In the reading operation, Y decoder 4 outputs any of the plurality of column select signals φR0, φR1, according to an address signal, and selects any of the plurality of reading main bit lines RBL0, RBL1.

In the writing operation, SG·SL decoder 5 selects one sub-block (BLKn, for example) of the plurality of sub-blocks BLK0–BLKn according to an address signal, renders select gate SGn0 of the selected sub-block BLKn conducting, and couples sub-bit lines SBL0, SBL1 of the selected sub-block BLKn to writing main bit lines WBL0, WBL1, respectively.

In the reading operation, SG·SL decoder 5 selects one sub-block (BLKn, for example) from the plurality of sub-blocks BLK0–BLKn according to an address signal, renders select gate SGn1 of the selected sub-block BLKn conducting, and couples sub-bit lines SBL0, SBL1 of the selected sub-block BLKn to reading main bit lines RBL0, RBL1, respectively.

Figure 3:
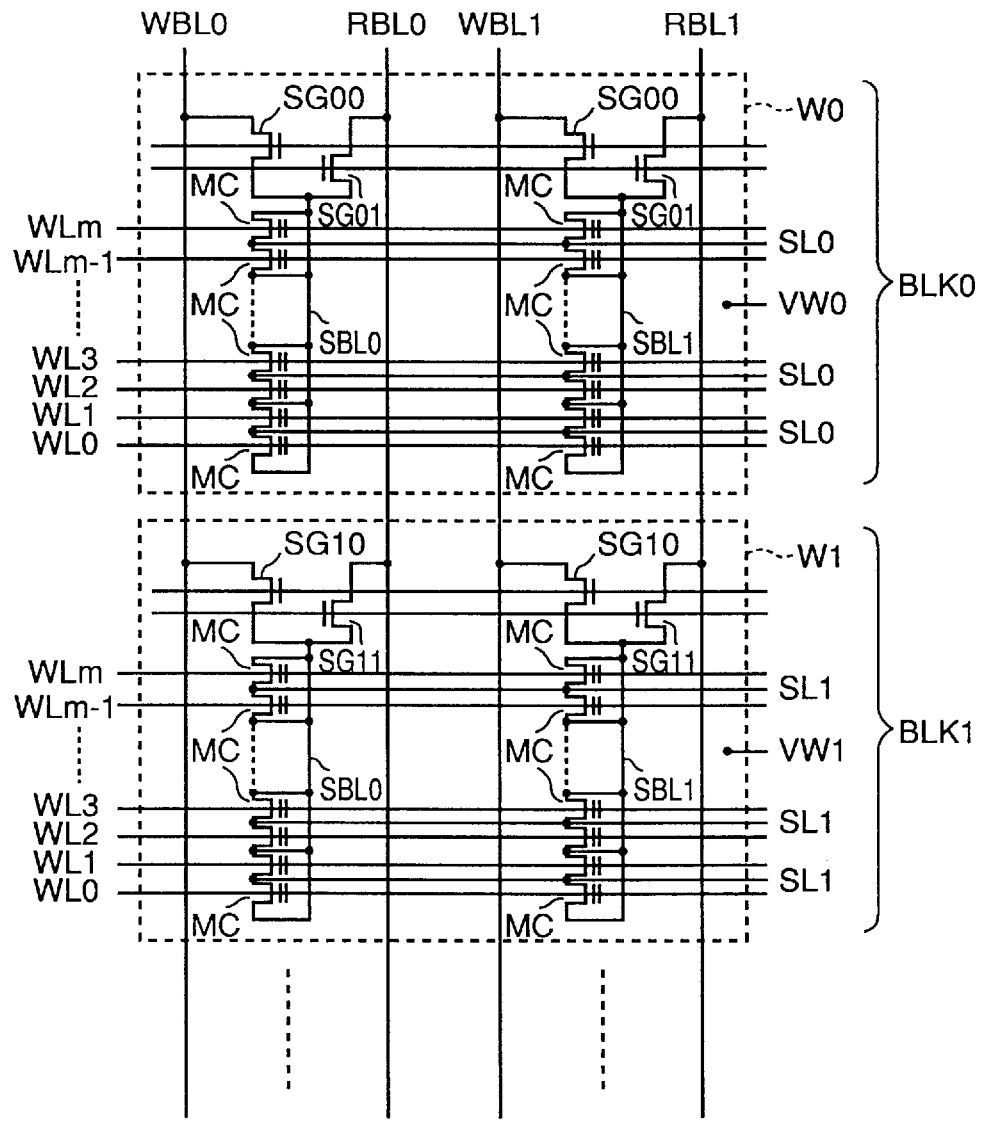
FIG. 3 is a diagram for illustrating an effect of the flash memory shown in FIG. 1.

In the BGO mode, SG·SL decoder 5 selects from the plurality of sub-blocks BLK0–BLKn a sub-block (e.g., BLK0) for writing data therein and another sub-block (e.g., BLK1) for reading data therefrom, according to address signals. As shown in FIG. 3, SG·SL decoder 5 then renders select gate SG00 of the selected sub-block BLK0 conducting and couples sub-bit lines SBL0, SBL1 of sub-block BLK0 to writing main bit lines WBL0, WBL1, respectively, and also, renders select gate SG11 of the selected sub-block BLK1 conducting and couples sub-bit lines SBL0, SBL1 of the sub-block BLK1 to reading main bit lines RBL0, RBL1, respectively.

Further, SG·SL decoder 5 puts each of the voltages VW0–VWn of wells W0–Wn to 0 V or 8 V and brings each of source lines SL0–SLn to an open state, 0 V or 8 V, depending on the operating mode and selected sub-blocks BLK0–BLKn.

Write/read circuit 6 includes, as illustrated in FIG. 2: a plurality of data buffers DB0, DB1, each provided for a respective one of the plurality of writing main bit lines WBL0, WBL1; a plurality of writing Y gates (N channel MOS transistors) WYG0, WYG1, each provided for a respective one of the plurality of writing main bit lines WBL0, WBL1; a plurality of reading Y gates (N channel MOS transistors) RYG0, RYG1, each provided for a respective one of the plurality of reading main bit lines RBL0, RBL1; data read lines RL0, RL1; a reading sense amplifier 10; a write control circuit 11; and a verifying sense amplifier 12.

Data buffers DB0 and DB1 are connected to writing main bit lines WBL0 and WBL1 respectively, and in response to write signals RS0, RS1 applied from write control circuit 11, provide writing voltage (+6 V) in a pulse manner to writing main bit lines WBL0, WBL1.

Writing Y gates WYG0, WYG1 are connected between writing main bit lines WBL0, WBL1 and data read line RL0 respectively, and receive respective column select signals φW0, φW1 output from Y decoder 4. When column select signal φW0 attains a selected, high level, for example, Y gate WYG0 is rendered conductive and writing main bit line WBL0 and data read line RL0 are coupled to each other.

Reading Y gates RYG0, RYG1 are connected between reading main bit lines RBL0, RBL1 and data read line RL1 respectively, and receive at their respective gates respective column select signals φR0, φR1 output from Y decoder 4. If column select signal φR0 attains a selected, high level, for example, Y gate RYG0 is brought into conduction and reading main bit line RBL0 is coupled to data read line RL1.

In the reading operation, reading sense amplifier 10 applies a voltage of 1 V to drain 61d of a selected memory cell MC, detects whether or not current flows therein, and outputs the data corresponding to the result of the detection via output buffer 8 to the outside.

In the write verifying operation, verifying sense amplifier 12 applies a voltage of 1 V to drain 61d of a selected memory cell MC, detects whether current Ic flows therein, and provides write control circuit 11 with write stop signal STP in response to current Ic flowing in. In the erase verifying operation, verifying sense amplifier 12 applies a voltage of 1 V to drain 61d of a selected memory cell MC, and detects whether or not current Ic flows therein. When current Ic stops flowing in, verifying sense amplifier 12 responsively provides X decoder 3 with an erase stop signal (not shown) to stop the erasing operation.

Write control circuit 11 provides write signal WS to data buffer DB according to data Din externally supplied through input buffer 7 and writes data into a selected memory cell MC, and completes the writing of the data into the memory cell in response to signal STP output from verifying sense amplifier 12.

Controller 9 selects a predetermined operating mode according to externally applied control signals /CE, /OE, /WE, and command signal CMD also externally applied through input buffer 7. Controller 9 controls the entire flash memory.

Now, an operation of this flash memory will be described in brief.

Initially, an operating mode is set by controller 9 provided with control signals /CE, /OE, /WE and command signal CMD.

In the writing operation, a voltage of −8 V is applied to the word line WL corresponding to a memory cell MC designated by address signals A0–Aj, so that the memory cell MC is connected to writing main bit line WBL via corresponding select gate (e.g., SGn0). Source line SL is brought into an open state and well voltage VWn is set to 0 V. In this state, by write control circuit 11 and data buffer DB, a voltage of +6 V is applied to writing main bit line WBL in a pulse manner, and data "0" is thus written into the selected memory cell MC over several steps. Whether or not writing of data "0" has been completed, or in other words, whether threshold voltage Vth of memory cell MC has attained to 2 V is determined by verifying sense amplifier 12.

In the erasing operation, the source line SLn and well voltage VWn of a sub-block (BLKn, for example) designated by address signals A0–Aj are set to −8 V. In this state, a voltage of +10 V is applied to word lines WL0–WLn of the sub-block BLKn in a pulse manner, and the data in a memory cell MC in the sub-block BLKn is thus erased over several steps. Again, verifying sense amplifier 12 verifies for each column whether erasing of data has been completed, i.e., whether threshold voltage Vth of memory cell MC has attained to 6 V.

In the reading operation, memory cell MC designated by address signals A0–Aj is connected to reading sense amplifier 10 via corresponding sub-bit line SBL, select gate (e.g., SGn1), reading main bit line RBL, reading Y gate RYG and data read line RL1. A voltage of +3.3 V is applied to the word line WL for the memory cell MC, and source line SLn and well voltage VWn are set to 0 V. The data in memory cell MC is read out by reading sense amplifier 10 and output via output buffer 7 to the outside.

In the BGO mode, data reading is effected at a sub-block (e.g., BLK0) while data writing/erasing is effected at another sub-block (e.g., BLK1). In this case, as shown in FIG. 3, memory cell MC in sub-block BLK0 is coupled to reading main bit line RBL0 via select gate SG01, whereas memory cell MC in sub-block BLK1 is coupled to writing main bit line WBL0 via select gate SG10. Source lines SL0 and SL1 are brought to 0 V and open −8 V, respectively, and well voltages VW0 and VW1 to 0 V and 0 V/−8 V, respectively.

According to this embodiment, each column is provided with writing main bit line WBL and reading main bit line RBL, and the voltage on source line SL and well voltage VW can be set for each sub-block BLK. Accordingly, data reading and data writing/erasing can be conducted simultaneously in a single memory cell array 2, and therefore, the capacity ratio of the BGO region to the main memory region can be set as desired.

Moreover, an X decoder, a Y decoder, an SG·SL decoder and a write/read circuit, each conventionally divided and arranged at two locations, can each be arranged at one location, and layout area can thus be advantageously reduced.

Figure 4:
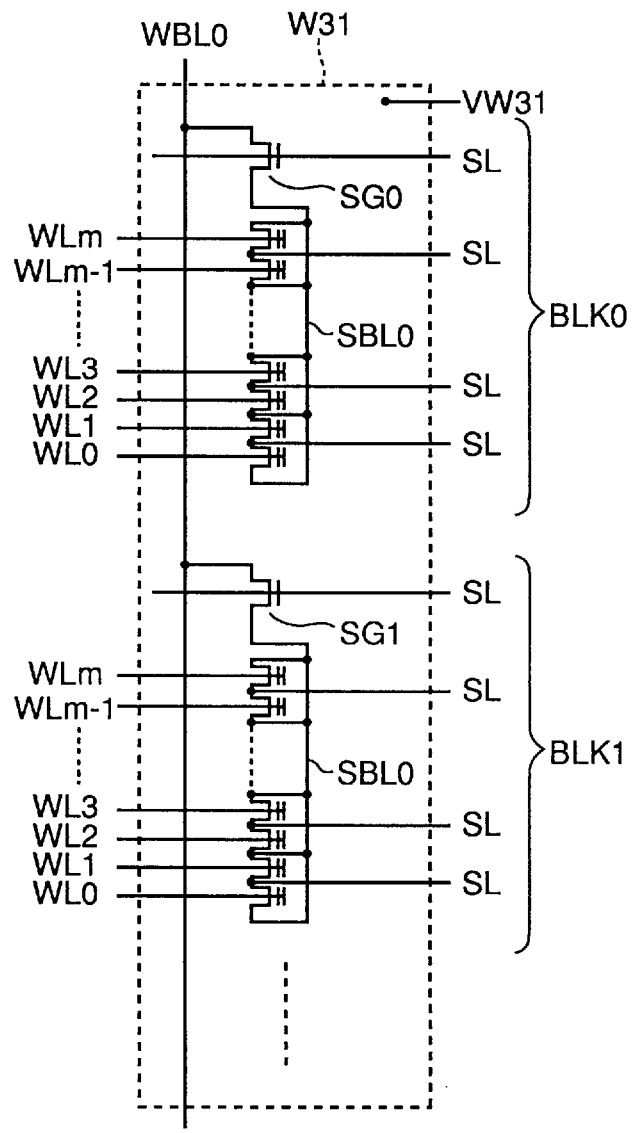
FIG. 4 is another diagram for illustrating the effect of the flash memory shown in FIG. 1.

Note that, in conventional flash memories, data reading and data writing/erasing cannot be effected simultaneously in a single memory cell array, since each column is provided with only one main bit line MBL, as illustrated in FIG. 4.

Second Embodiment

Figure 5:
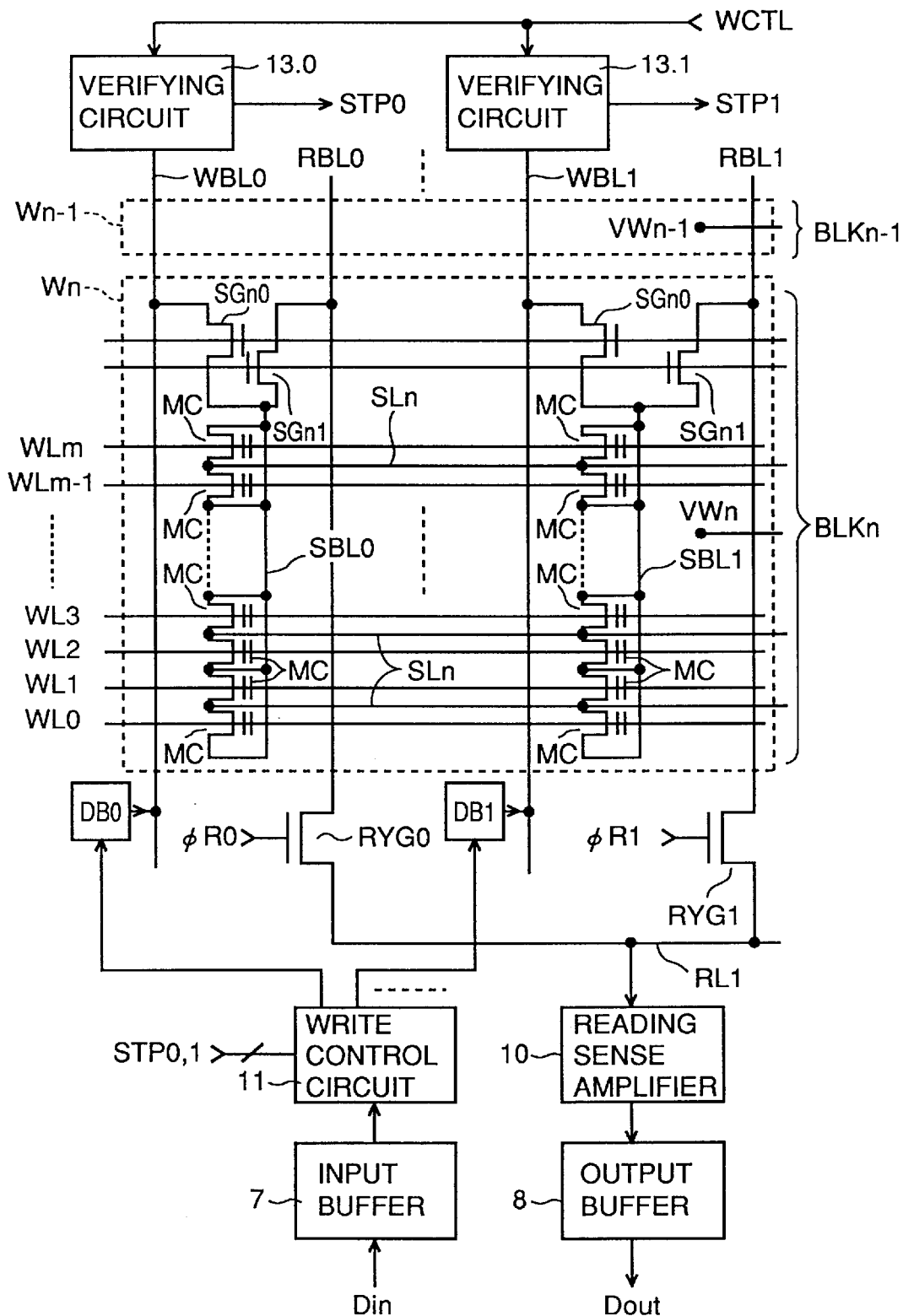
FIG. 5 is a block circuit diagram showing the configuration of the main portion of a flash memory according to a second embodiment of the present invention.

FIG. 5 is a partially omitted, block circuit diagram showing the main portion of a flash memory according to the second embodiment of the present invention, in contrast with FIG. 2.

Referring to FIG. 5, the flash memory of the second embodiment is same as that of the first embodiment, except that the former is newly provided with verifying circuits 13.0, 13.1, instead of verifying sense amplifier 12, writing Y gates WYG0, WYG1, and data read line RL0 in the latter. Verifying circuit 13.0, 13.1, respectively, are provided corresponding to writing main bit lines WBL0, WBL1.

Figure 6:
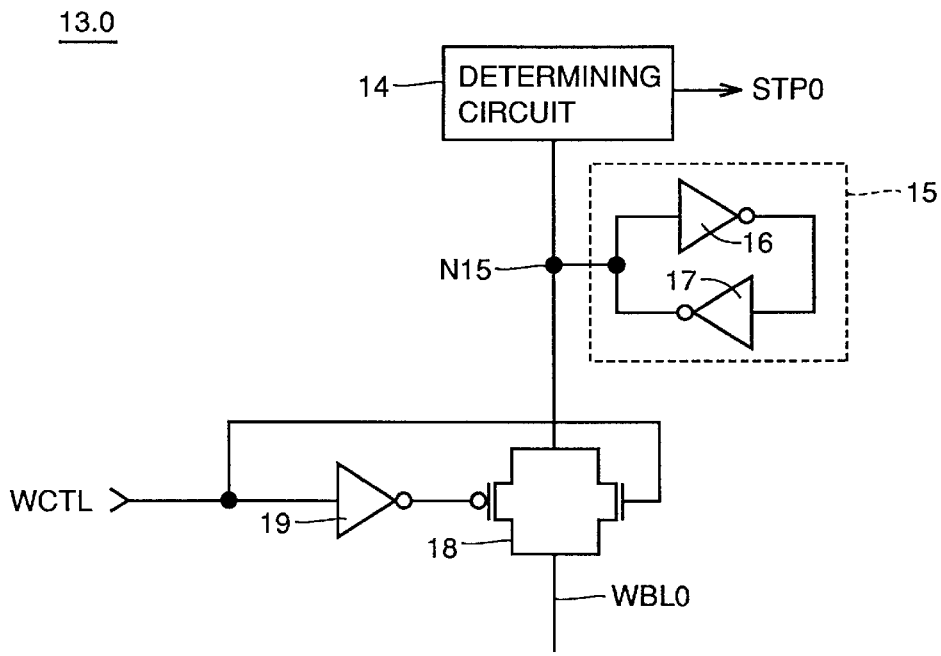
FIG. 6 is a block circuit diagram showing the configuration of the verifying circuit shown in FIG. 5.

As shown in FIG. 6, verifying circuit 13.0 includes a determining circuit 14, a latch circuit 15, a transfer gate 18, and an inverter 19. Transfer gate 18 is connected between a node N15 and the corresponding writing main bit line WBL0. A signal WCTL is input to transfer gate 18, directly to its gate at the N channel MOS transistor side as well as to its gate at the P channel MOS transistor side via inverter 19. Latch circuit 15 includes a pair of inverters 16, 17, connected in an anti-parallel manner, and latches a signal appearing at node N15.

Determining circuit 14 detects whether or not writing has been completed according to a signal appearing at node N15, and when completed, provides a write stop signal STP0 to a write control circuit 11. Determining circuit 14 also detects whether or not erasing has been completed according to a signal appearing at node N15, and in response to its completion, provides an erase stop signal (not shown) to an X decoder 3. Verifying circuit 13.1 has a configuration identical to verifying circuit 13.0.

Next, the operation of this flash memory will be described. In the write verifying operation, after writing is completed, a writing main bit line (WBL0, for example) used for the writing is charged to a high level by a data buffer DB0, and node N15 of verifying circuit 13.0, which corresponds to that writing main bit line WBL0, is also charged to a high level by determining circuit 14. The level of node N15 is latched by latch circuit 15.

Thereafter, a word line (e.g., WLm) corresponding to a block (e.g., BLKn) in which data was written into memory cell MC, is raised to a write verifying voltage of 2.5 V, source line SLn and well Wn are set to 0 V, and select gate SGn0 used for the writing is rendered conductive. At this time, if the writing is completed, a cell current flows, whereby writing main bit line WBL0 attains a low level; otherwise, it is held at a high level since the cell current will not flow.

Thereafter, signal WCTL is raised to a high level for a prescribed time to render transfer gate 18 of verifying circuit 13.0 conducting for the prescribed time. Accordingly, if the writing is completed, node N15 is at a low level, and if the writing is not completed yet, node N15 is at a high level. The level of node N15 is latched by latch circuit 15. When node N15 is at a low level, determining circuit 14 provides write control circuit 11 with write stop signal STP0 to stop writing. When node N15 is at a high level, it causes writing control circuit 11 to effect the writing operation again. Writing will be conducted repeatedly until the potential of node N15 is reversed from the high level to the low level.

In the erase verifying operation, after erasing is completed, a writing main bit line (e.g., WBL0) is charged to a high level by data buffer DB0, and node N15 of verifying circuit 13.0 corresponding to that writing main bit line WBL0 is also charged to a high level by determining circuit 14. The potential of node N15 is latched by latch circuit 15.

Thereafter, word lines WL0-WLm for a block (e.g., BLKn), in which the erase operation was conducted, are raised to a erase verifying voltage of +5.5 V, source line SLn and well Wn are set to 0 V, and select gate SGn0 of block BLKn in which the erasing was effected is rendered conductive. At this time, if the erasing has been completed, writing main bit line WBL0 is held at a high level, since no cell current flows. On the other hand, if the erasing is not completed, the cell current flows, whereby writing main bit line WBL0 attains a low level.

Thereafter, signal WCTL is raised to a high level for a prescribed time, and transfer gate 18 in verifying circuit 13.0 is rendered conductive for the prescribed time. Consequently, if the erasing is completed, node N15 is at a high level; otherwise, it is at a low level. The level of node N15 is latched by latch circuit 15. When node N15 is at a high level, determining circuit 14 provides X decoder 3 with an erase stop signal to stop erasing. When node N15 is at a low level, it causes X decoder 3 to effect erasing again. Erasing will then be continued until the potentials of nodes N15 in verifying circuits 13.0, 13.1 are stabilized at a high level and no longer reversed.

Note that, in the erase verifying operation, the threshold voltage of memory cell MC need not take a predetermined value; it only need to be greater than 6 V. Other than what was described above, the configuration and operation of the flash memory of this embodiment are similar to those in the first embodiment, and thus the explanation will not be repeated.

With such a simple configuration, the second embodiment not only accomplishes the same effects as the first embodiment, but also allows a plurality of memory cells MC to be verified simultaneously.

Third Embodiment

Figure 7:
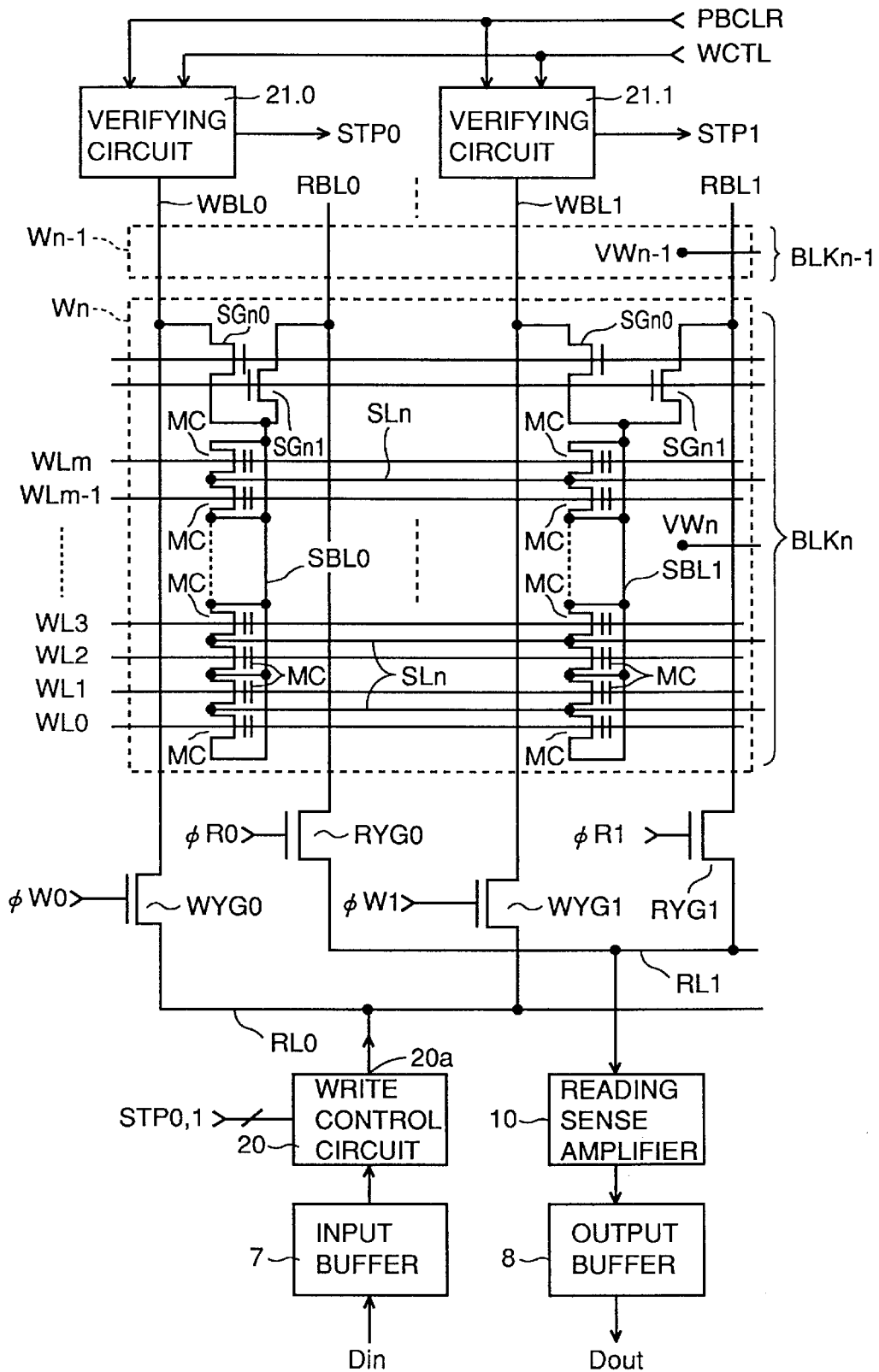
FIG. 7 is a block circuit diagram showing the configuration of the main portion of a flash memory according to a third embodiment of the present invention.
Figure 9:
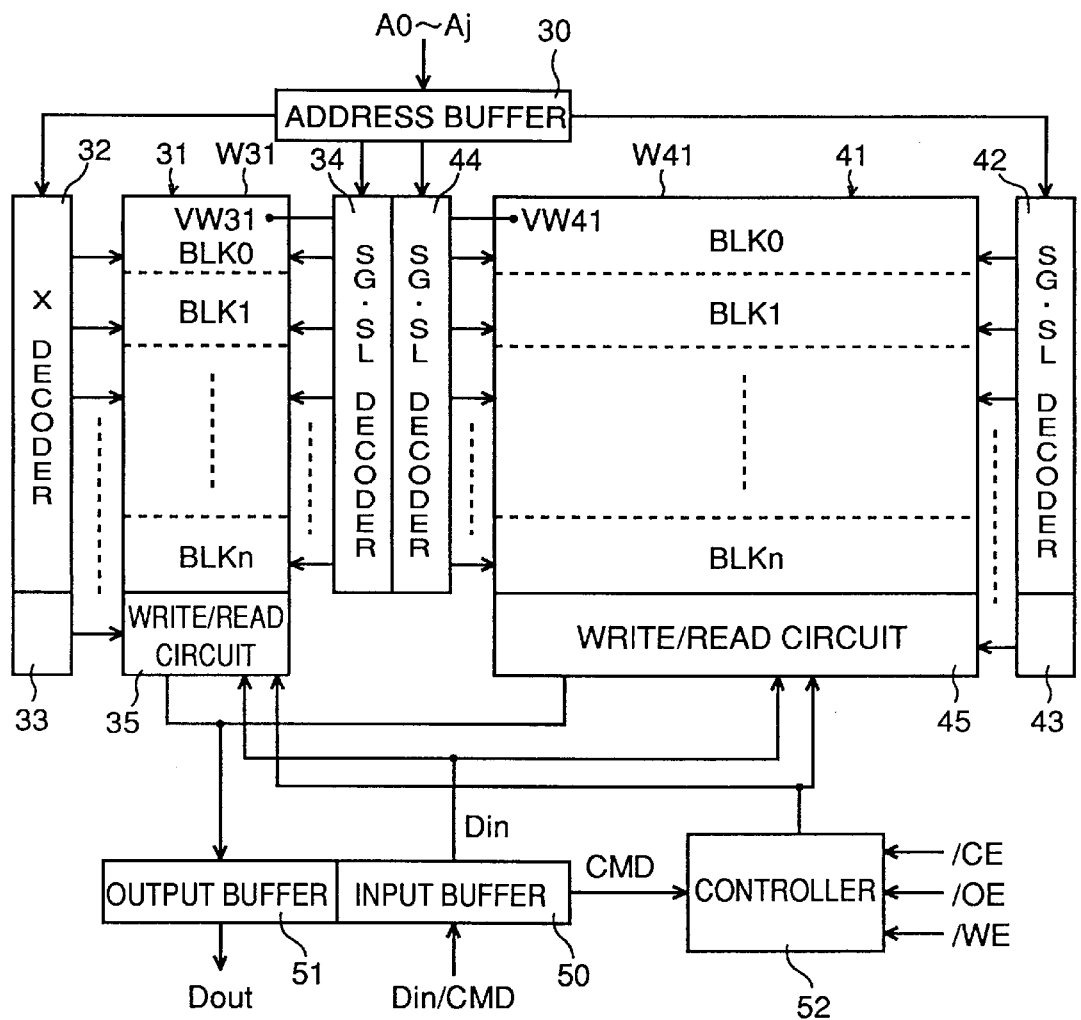
FIG. 9 is a partially omitted block diagram showing the configuration of a conventional flash memory.
Figure 10:
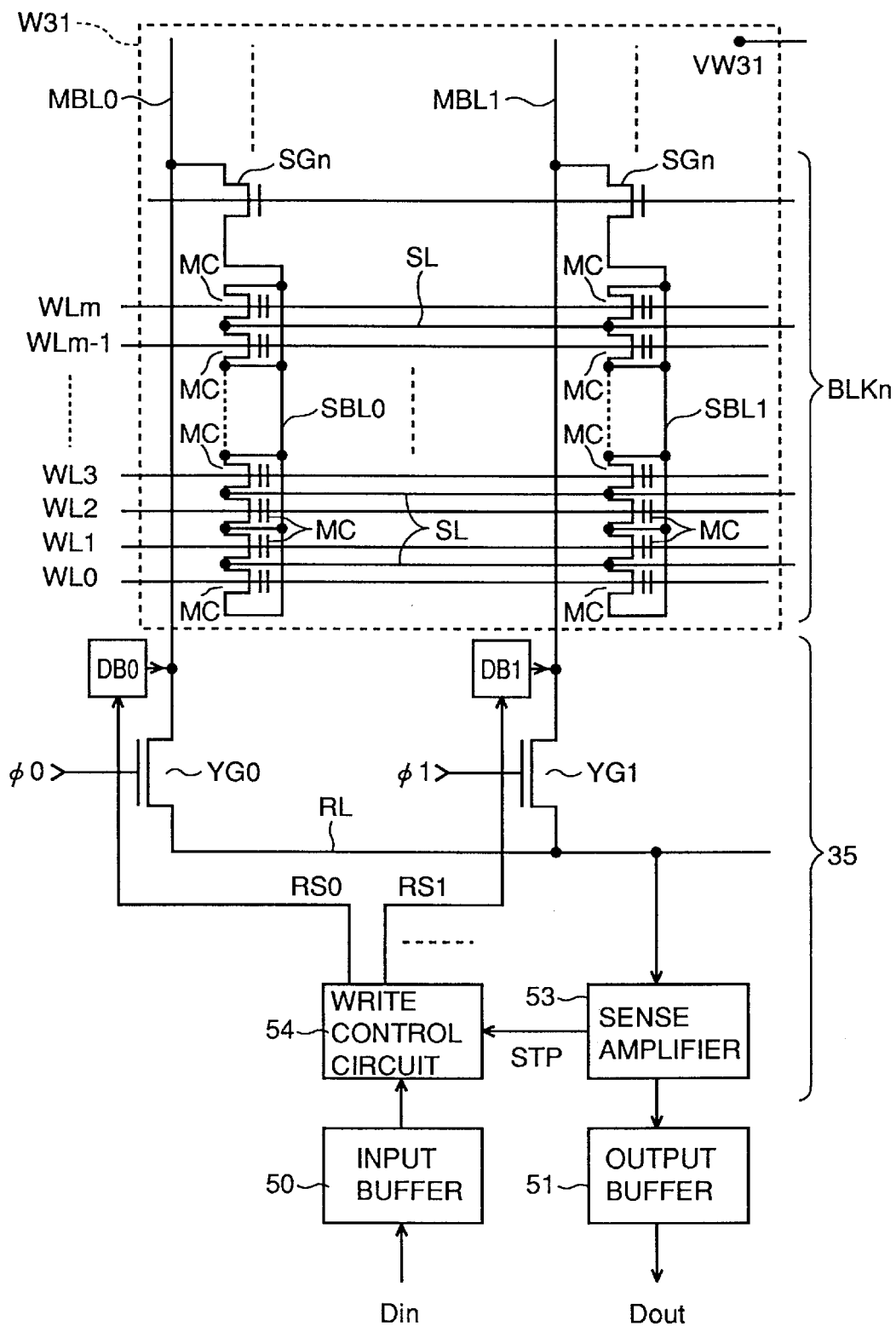
FIG. 10 is a block circuit diagram showing a main portion of the flash memory shown in FIG. 9.
Figure 11A:
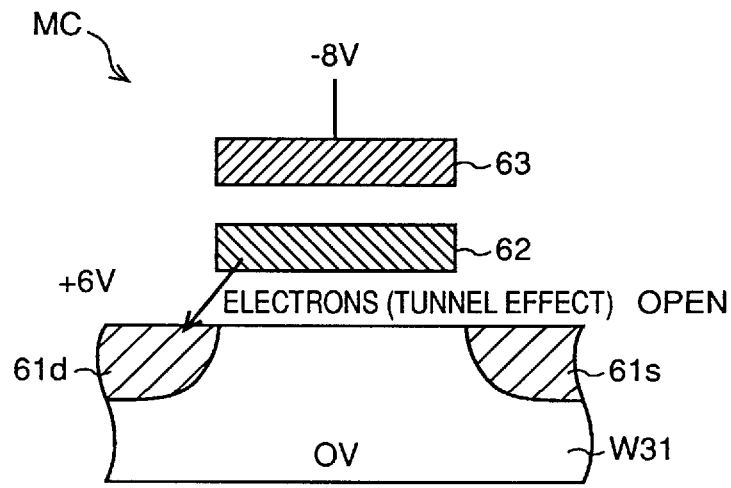
FIGS. 11A and 11B are diagrams for illustrating the configuration and operation of the memory cell shown in FIG. 10.
Figure 11B:
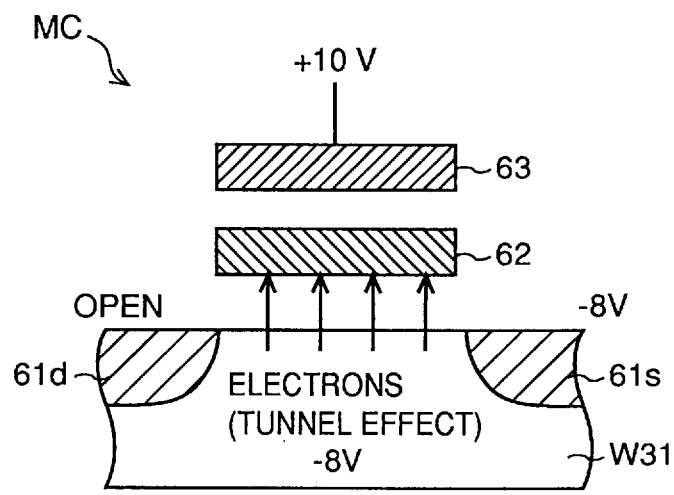
Figure 12:
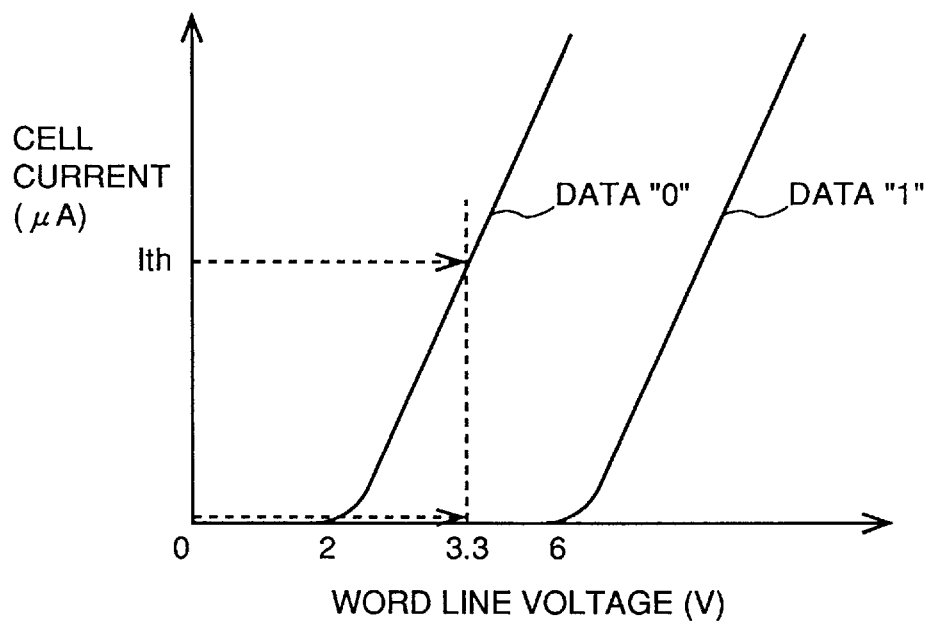
FIG. 12 is a diagram for illustrating an operation of the memory cell shown in FIGS. 11A and 11B.

FIG. 7 is a partially omitted, block circuit diagram showing the main portion of a flash memory according to the third embodiment of the present invention, in contrast with FIG. 2. With reference to FIG. 7, this flash memory is different from that of the first embodiment in that verifying circuits 21.0, 21.1 are newly provided, verifying sense amplifier 12 and data buffers DB0, DB1 are removed, and former write control circuit 11 has been replaced by a write control circuit 20. In addition, data read line RL0 is now utilized as a data write line.

Verifying circuits 21.0, 21.1 are provided corresponding to writing main bit lines WBL0, WBL1, respectively. As seen from FIG. 8, verifying circuit 21.0 is an equivalent to verifying circuit 13.0 of FIG. 6 with an N channel MOS transistor 22 added thereto. N channel MOS transistor 22 is connected between node N15 and a line with a ground potential GND, and has a gate receiving a signal PBCLR. In the verifying operation, with N channel MOS transistor 22 non-conductive, verifying circuit 21.0 has the same configuration and thus operates in the same way as verifying circuit 13.0 of FIG. 6. In the writing operation, latch circuit 15 and N channel MOS transistor 22 are utilized as a data buffer. Verifying circuit 21.1 is identical to verifying circuit 21.0.

An output node 20a of write control circuit 20 is connected to data write line RL0. In the writing operation, write control circuit 20 provides verifying circuits 21.0, 21.1 with a write signal at a high level via data write line RL0, writing Y gates WYG0, WYG1, and writing main bit lines WBL0, WBL1 to cause the verifying circuits to effect data writing.

Figure 8:
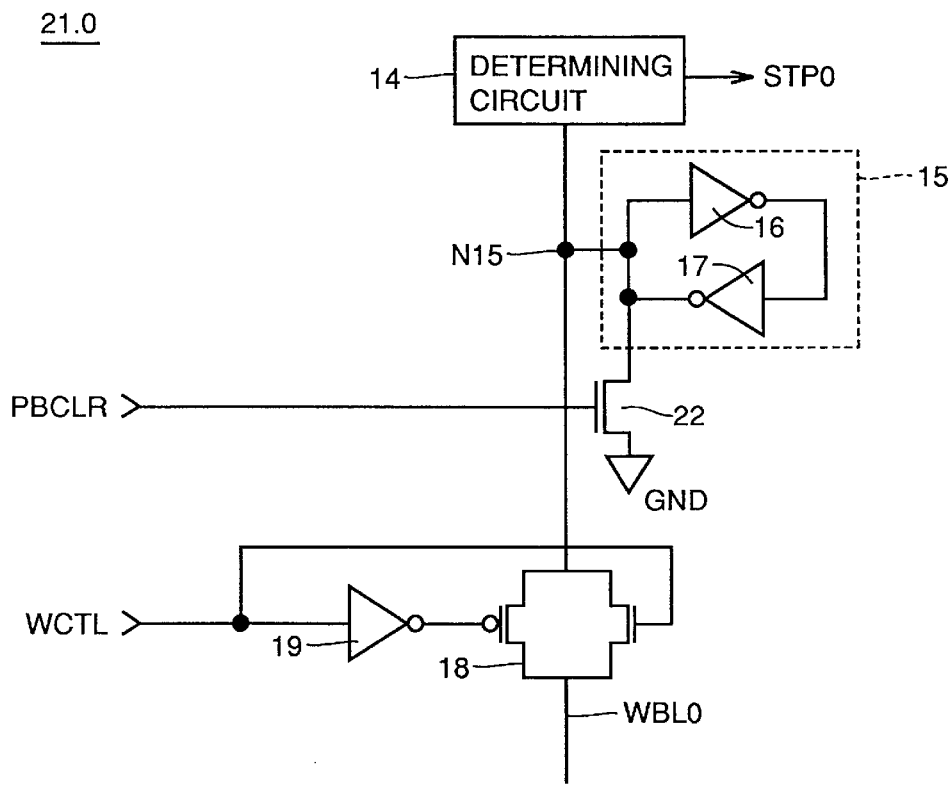
FIG. 8 is a block circuit diagram showing the configuration of the verifying circuit shown in FIG. 7.

Next, the operation of the flash memory shown in FIGS. 7 and 8 will be described. In the writing operation, signal PBCLR is firstly set at a high level for a prescribed time to render N channel MOS transistor 22 conducting, and node N15 attains a low level. The level of node N15 is latched by latch circuit 15.

Thereafter, a writing Y gate (e.g., WYG0) for a column corresponding to memory cell MC into which data is to be written is rendered conductive. In this state, a write signal at a high level is output from write control circuit 20 via writing Y gate WYG0 to raise writing main bit line WBL0 to a high level.

Signal WCTL is then raised to a high level to render transfer gates 18 of verifying circuits 21.0, 21.1 conducting, and node N15 of verifying circuit 21.0 attains a high level.

The level of node N15 is latched by latch circuit 15, the output of which is provided to writing main bit line WBL0. The level of writing main bit line WBL0 is provided via selected gate SGn0 corresponding to a block (e.g., BLKn) including memory cell MC into which data is to be written, to the drain of that memory cell MC. A word line (e.g., WLm) corresponding to the memory cell is held at −8 V for a prescribed time, whereby data writing is effected.

In the write verifying and erase verifying operations, signal PBCLR attains a low level, and N channel MOS transistor 22 is rendered conductive. Verifying circuit 21.0 is thus effectively the same in configuration as verifying circuit 13.0. In this embodiment, charging of writing main bit lines WBL0, WBL1 is conducted by write control circuit 20 and writing Y gate WYG0, WYG1, instead of write control circuit 11 and data buffers DB0, DB1 as in the second embodiment. Otherwise, the operations of these two embodiments are similar.

In addition to yielding the same effects as in the second embodiment, this embodiment allows layout area to be reduced by the area for data buffers DB0, DB1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device having a back ground operation mode for reading data and writing/erasing data in a parallel manner, comprising:

a plurality of memory cells arranged in rows and columns, each row being formed in a specific well;

a word line provided corresponding to a respective row and connected to a control gate of a corresponding memory cell;

a voltage control line provided corresponding to a respective row and connected to a first conduction node of a corresponding memory cell;

a reading bit line provided corresponding to a respective column for performing data reading at a corresponding memory cell;

a writing bit line provided corresponding to a respective column for performing data writing at a corresponding memory cell;

selection means responsive to address signals for selecting a memory cell in a row for which said data reading is to be performed and a memory cell in another row for which said data writing/erasing is to be performed;

first connection means for connecting a second conductive node of the memory cell selected by said selection means for said data reading to the corresponding reading line;

second connection means for connecting a second conductive node of the memory cell selected by said selection means for said data writing to the corresponding writing bit line; and mode execution means for executing said back ground operation mode.

2. The non-volatile semiconductor memory device according to claim 1, wherein said mode execution means includes read means for controlling each potential of said well, said word line and said voltage control line to set the memory cell, selected by said selection means for said data reading, to a read enabled state, and reading data from the memory cell via the reading bit line corresponding to the memory cell, write means for controlling each potential of said well and said word line to set the memory cell, selected by said selection means for said data writing, to a write enabled state, and writing data into the memory cell via the writing bit line corresponding to the memory cell, and erase means for controlling each potential of said well, said word line and said voltage control line, and erasing data from the memory cell selected by said selection means for said data erasing.

3. The non-volatile semiconductor memory device according to claim 2, wherein said write means performs said data writing in several steps, said erase means performs said data erasing in several steps, said second connection means connects the second conductive node of the memory cell selected by said selection means for said data writing/erasing to the corresponding writing bit line, said mode execution means further includes first verifying means, after each data writing operation by said write means, for detecting via the writing bit line corresponding to the memory cell having data written therein a threshold voltage of the memory cell, and, in response to the detected value reaching a first predetermined value, stopping the subsequent data writing operation by said write means, and second verifying means, after each data erasing operation by said erase means, for detecting via the writing bit line corresponding to the memory cell having data erased therefrom a threshold voltage of the memory cell, and, in response to the detected value reaching a second predetermined value, stopping the subsequent data erasing operation by said erase means.

4. The non-volatile semiconductor memory device according to claim 2, wherein said write means performs said data writing in several steps, said erase means performs said data erasing in several steps, said second connection means connects the second conductive node of the memory cell selected by said selection means for said data writing/erasing to the corresponding writing bit line, said mode execution means further includes first verifying means, after each data writing operation by said write means, for charging the writing bit line corresponding to the memory cell having data written therein to a reference potential, then controlling each potential of said well, said word line, and said voltage control line to set the memory cell to a read enabled state, and, when said thus charged writing bit line is discharged, stopping the subsequent data writing operation by said write means, and second verifying means, after each data erasing operation by said erase means, for charging the writing bit line corresponding to the memory cell having data erased therefrom to a reference potential, then controlling each potential of said well, said word line, and said voltage control line to set the memory cell to a read enabled state, and when said thus charged writing bit line is not discharged, stopping the subsequent data erasing operation by said erase means.

5. A non-volatile semiconductor memory device having a back ground operation mode for reading data and writing/erasing data in a parallel manner, comprising:

a plurality of memory cell arrays each formed on a respective, specific well and including a plurality of memory cells arranged in rows and columns;

a word line provided corresponding to a respective column in a respective memory cell array and connected to a control gate of a corresponding memory cell;

a voltage control line provided corresponding to a respective row in a respective memory cell array and connected to a first conduction node of a corresponding memory cell;

a reading bit line provided corresponding to a respective column commonly over said plurality of memory cell arrays for performing data reading at a corresponding memory cell;

a writing bit line provided corresponding to a respective column commonly over said plurality of memory cells arrays for performing data writing at a corresponding memory cell;

selection means responsive to address signals for selecting a memory cell in a memory cell array for which said data reading is to be performed and a memory cell in another memory cell array for which said data writing/erasing is to be performed;

first connection means for connecting a second conductive node of the memory cell selected by said selection means for said data reading to the corresponding reading bit line;

second connection means for connecting a second conductive node of the memory cell selected by said selection means for said data writing to the corresponding writing bit line; and mode execution means for executing said back ground operation mode.

* * * * *